US00H002155H

(19) United States

(12) Statutory Invention Registration (10) Reg. No.: US H2155 H

Tsui et al. (43) Published: May 2, 2006

(54) DOWNCONVERT AND AVERAGE IDENTIFICATION OF BIPHASE CODED SIGNAL CARRIER

(75) Inventors: James B. Y. Tsui, Dayton, OH (US); David M. Lin, Beavercreek, OH (US)

(73) Assignee: The United States of America as represented by the Secretary of the Air Force, Washington, DC (US)

(21) Appl. No.: 10/057,864

(22) Filed: Jan. 28, 2002

(51) Int. Cl.
*H03D 3/22* (2006.01)

(52) U.S. Cl. ..... 375/333; 375/316; 375/322; 375/324; 375/354; 375/361

(58) Field of Classification Search ..... 375/130, 375/147, 286, 289, 316, 333, 329, 322, 354, 375/361
See application file for complete search history.

(56) References Cited

U.S. PATENT DOCUMENTS

| | | | | |
|---|---|---|---|---|
| 4,457,006 A | | 6/1984 | Maine | |
| 4,578,678 A | * | 3/1986 | Hurd | 342/357.12 |
| 4,754,283 A | | 6/1988 | Fowler | |
| 4,847,862 A | | 7/1989 | Braisted et al. | |
| 4,928,106 A | | 5/1990 | Ashjaee et al. | |
| 4,972,431 A | | 11/1990 | Keegan | |
| 5,271,034 A | * | 12/1993 | Abaunza | 375/150 |
| 5,467,282 A | | 11/1995 | Dennis | |
| 5,535,278 A | | 7/1996 | Cahn et al. | |
| 5,621,416 A | | 4/1997 | Lennen | |
| 5,689,271 A | | 11/1997 | Lennen | |
| 5,963,582 A | | 10/1999 | Stansell, Jr. | |
| 6,044,071 A | | 3/2000 | Spilker, Jr. | |
| 6,125,135 A | | 9/2000 | Woo et al. | |
| 6,148,022 A | | 11/2000 | Raghavan et al. | |
| 2003/0016169 A1 | * | 1/2003 | Jandrell | 342/357.12 |
| 2003/0021237 A1 | * | 1/2003 | Min et al. | 370/252 |
| 2003/0128158 A1 | * | 7/2003 | Jandrell | 342/357.12 |

* cited by examiner

*Primary Examiner*—M. Clement
(74) *Attorney, Agent, or Firm*—Gerald B. Hollins

(57) ABSTRACT

An improved apparatus and method for determining the carrier frequency in a biphase coded signal such as the course acquisition code signal in a global position sensing system. The described system may also be used for other purposes. The described system is based on use of the conventional data signal squaring or frequency doubling step to remove biphase coding but performs a series of frequency reducing steps prior to applying the Fourier transformation sequence. The frequency reducing steps include heterodyne mixing and signal averaging. These frequency-reducing steps diminish the speed and capacity requirements imposed on the Fourier transformation sequence and thereby decrease the cost and complexity of the overall system.

17 Claims, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

DOWNCONVERT AND AVERAGE IDENTIFICATION OF BIPHASE CODED SIGNAL CARRIER

RIGHTS OF THE GOVERNMENT

The invention described herein may be manufactured and used by or for the Government of the United States for all governmental purposes without the payment of any royalty.

BACKGROUND OF THE INVENTION

In order to acquire and process a biphase-coded signal such as the NAVSTAR/global position system (GPS) Coarse/Acquisition or Clear/Acquisition [C/A] code signal one needs to find the carrier frequency and the initial phase in the suppressed carrier signal received from a GPS satellite. The purpose of the acquisition system usually employed in a GPS receiver is to accomplish just these carrier frequency and initial phase determination functions in a signal, which actually has no carrier presence. Such an acquisition system in fact needs to perform a two-dimensional searching, i.e., searching in time and searching in frequency. This operation is time consuming; however, if one of the quantities is identified the other can be obtained rather easily because the search then becomes one-dimensional in nature.

A known signal processing method to determine the carrier frequency of a biphase-coded signal includes the step of squaring the frequency representation in order to remove the appended biphase code from the signal. Such a squaring operation in fact both doubles the frequency involved and eliminates the phase modulation component of the signal. In order to demonstrate this action a biphase coded signal, s(f), may be expressed mathematically in terms of $$s=A\sin(2\pi ft+\phi) \tag{1}$$

where A represents the signal amplitude, f represents the signal carrier frequency and $\phi$represents the phase modulation impressed on the carrier ($\phi$ assumes values of $+\pi$ and $-\pi$ in representing biphase modulation). If a signal represented by equation 1 is processed by mathematical squaring the results are $$s^2 = A^2\sin^2(2\pi ft + \phi) = \frac{-A^2}{2}[1 - \cos(4\pi ft + 2\phi)] = \frac{A^2}{2}[1 - \cos(4\pi ft)] \tag{2}$$

In the final of the equation 2 three equalities the phase term, $\phi$, has been eliminated through use of this squaring process. The carrier frequency of the received signal can be determined by way of fast Fourier transformation (FFT) processing of the squared signal representation; such Fourier transformation processing is a part of both the known signal processing and the present invention improvements.

In a real world environment with noise-inclusive signals this squaring process has the effect of increasing the noise component in the processed signal, especially under conditions where the noise is of greater magnitude than the signal and the bandwidth is relatively large. Therefore in order to find a signal a long record of data is often used. To perform Fourier transformation on a long data record is however complicated and time consuming. The present invention avoids these difficulties with a reduced Fourier transformation requirement.

SUMMARY OF THE INVENTION

The present invention provides a simplified frequency doubling-based carrier frequency determination for a biphase coded signal.

It is therefore an object of the present invention to provide an alternate biphase coded signal carrier frequency determination arrangement.

It is another object of the invention to provide carrier frequency determination arrangement that is based on the data squaring or frequency doubling principle.

It is another object of the invention to provide a carrier frequency determination arrangement in which the addition of several steps results in a simplification of the overall frequency determination process.

It is another object of the invention to provide a carrier frequency determination arrangement in which frequency reducing steps enable a simplified computation.

It is another object of the invention to provide a carrier frequency determination arrangement which may be practiced in either the off-line or real-time operating modes.

It is another object of the invention to provide a carrier frequency determination arrangement which may be embodided in the form of either a hardware or a software algorithm.

It is another object of the invention to provide a frequency determination arrangement usable to advantage in decoding a global position system signal component.

It is another object of the invention to provide a frequency determination arrangement usable to advantage in decoding a plurality of global position system signal components.

It is another object of the invention to provide a frequency determination arrangement usable to advantage in determining the received course acquisition code component of a global position system signal.

It is another object of the invention to simplify the frequency doubling based calculation scheme for biphase-coded signals.

These and other objects of the invention will become apparent as the description of the representative embodiments proceeds.

These and other objects of the invention are achieved by the method of determining frequency content of a biphase code-modulated radio frequency input signal, said method comprising the steps of:

converting a sample of said biphase code-modulated radio frequency input signal from an analog signal format to a first sequence of digital signals;

generating a second sequence of signals from said first sequence of digital signals of performing a point by point squaring of said first sequence digital signals;

removing a direct current component from said squared first sequence, second sequence, signals to form a third sequence of signals;

mixing a local oscillator signal with said third sequence signals to form a frequency down converted sequence of real signal and imaginary signal complex value pairs;

averaging selected length groupings of said real signal and said imaginary signal complex value pairs to form lowered frequency representations of said real signal sequence and said imaginary signal sequence;

combining said lowered frequency real signal sequence and said lowered frequency imaginary signal sequence to form a composite lowered frequency representation of said biphase code-modulated input signal;

identifying included carrier frequency components of said biphase-code-modulated input signal by performing a Fourier transformation on said composite lowered frequency representation of said frequency down converted signals.

BRIEF DESCRIPTION OF THE DRAWING

The accompanying drawings incorporated in and forming a part of the specification, illustrates several aspects of the present invention and together with the description serve to explain the principles of the invention. In the drawings.

DETAILED DESCRIPTION OF THE INVENTION

In the present invention the known data squaring process for determination of carrier frequency in a received biphase-modulated signal is improved-upon by the addition of processing steps enabling a reduction in the complexity and cost of subsequently-needed processing steps including a Fourier transformation step. The invention also provides an averaging removal of signal noise components.

The underlying principle of the invention is to change a processing-doubled frequency into a low frequency and through signal averaging reducing the total number of data points to be processed.

Figure 1:
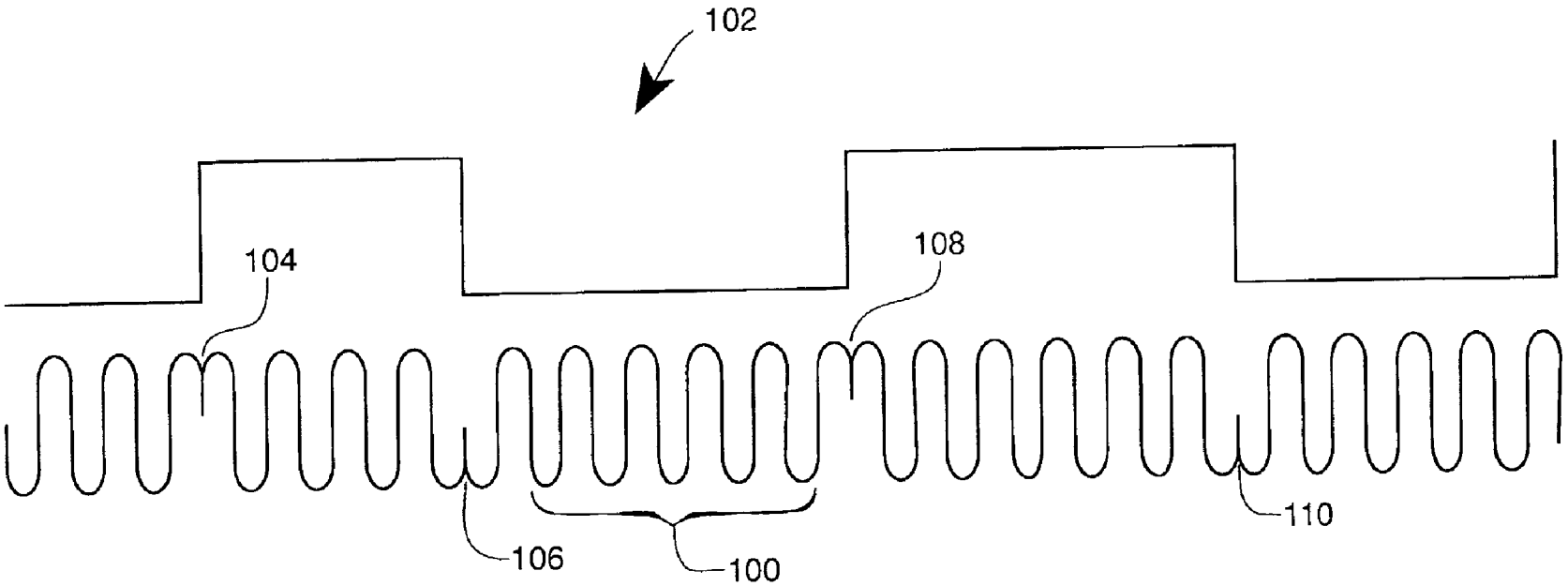
FIG. 1 shows an example of a biphase coded signal carrier and the related digital data.

A GPS signal may be used as an exemplary input signal to illustrate the operation of the invention. For this purpose it may be noted that the L1 band of the GPS signal is located at a carrier frequency of 1575.42 megahertz. The C/A code signal is biphase modulated onto this carrier by a frequency of 1.023 megahertz, therefore, the bandwidth of the modulated signal is 2.046 megahertz. FIG. 1 in the drawings shows a representation of this biphase code modulated carrier signal together with the digital data corresponding to the illustrated biphase coding. In FIG. 1 the sinusoidal cycles at 100 represent the 1575.42 megahertz carrier frequency and the digital signal at 102 indicates the data represented by the phasing perturbations in the sinusoidal data, the perturbations visible at 104, 106, 108 and 110 in the sinusoidal cycles 100. It is the goal of the present invention to enable a radio receiver apparatus encountering the FIG. 1 carrier 100 to rapidly and accurately determine the frequency of the sinusoid 100 notwithstanding the presence of the phase modulation perturbations at 104, 106, 108 and 110 in the sinusoid waveform and notwithstanding the presence of noise in the received signal. Reproduction and utilization of the digital data represented by the received signal sinusoid perturbations, i.e., the digital data 102 in FIG. 1, occurs in other parts of the receiver and do not form parts of the present invention.

In a biphase modulated signal the modulation can shift the phase of the carrier by either of two different values, a shift forward by $\pi$ radians or one hundred eighty degrees and a shift backward by $\pi$ radians or one hundred eighty degrees. The phase perturbations at 104 and 108 in FIG. 1 are examples of the former of these modulation changes and the perturbations at 106 and 110 examples of the latter.

Figure 2:
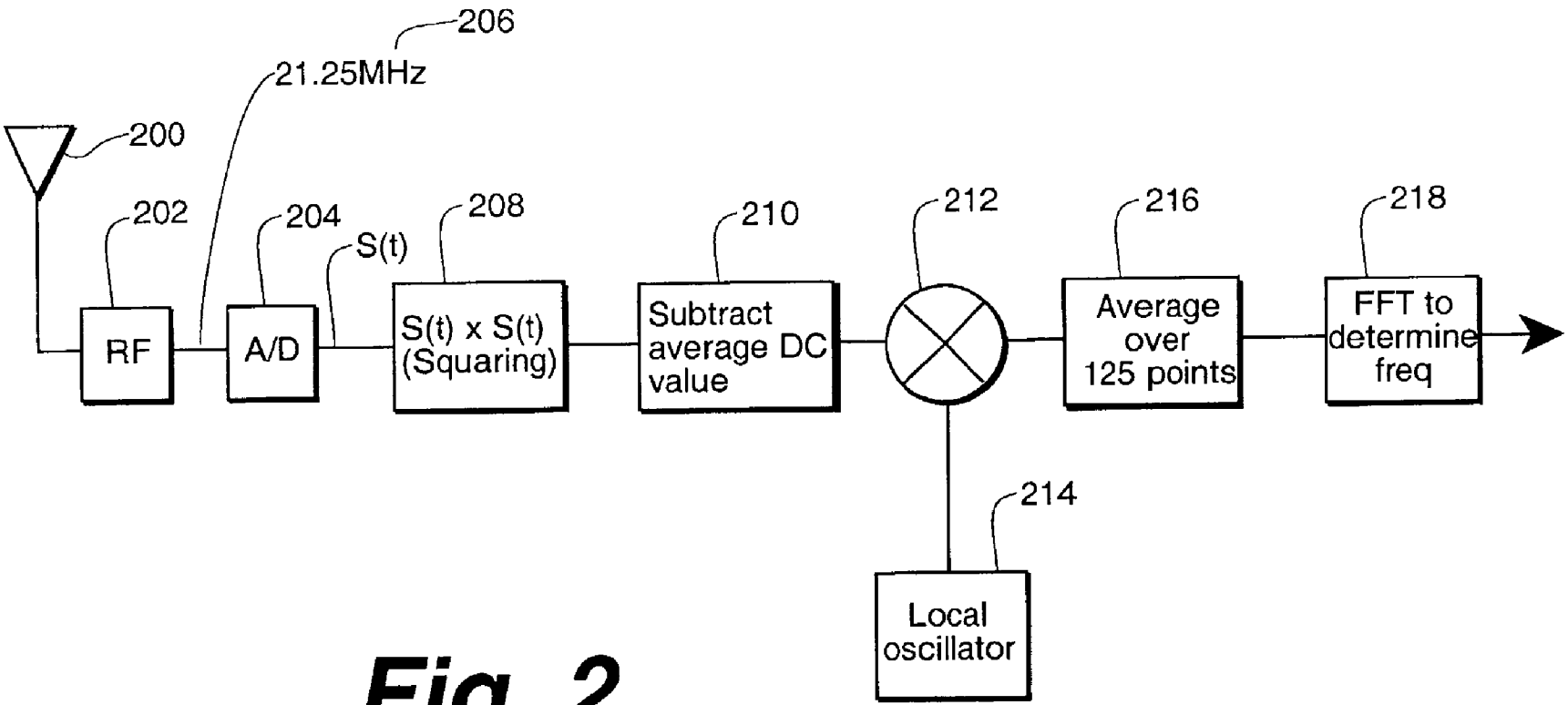
FIG. 2 shows a block diagram of a carrier frequency determination system according to the present invention.

According to a conventional approach to identifying the carrier frequency in data of the FIG. 1 type, the input signal will be squared and Fourier transformation will be performed directly on the squared data. If 100 ms of data digitized at 5 megahertz were used for this operation, the data would contain 500,000 points. One thus needs to perform a 500,000 point FFT, an operation that is time consuming. We have however found that it is possible to use considerably less than this 500,000 points of data in the Fourier transformation while obtaining desirable carrier frequency determination accuracy. FIG. 2 in the drawings shows a system for accomplishing this task in the manner of the present invention. An underlying rationale of the FIG. 2 system is to reduce the amount of data to be processed in the Fourier transformation to a more manageable level, a level possibly enabling of on line or real time Fourier transformation processing.

In the FIG. 2 drawing there is therefore shown a system and a method by which the carrier frequency of a biphase modulated signal may be determined. The FIG. 2 system may be embodied in the form of either hardware or software and in either instance may operate in either the real time or the off line operating modes depending on use application conditions. In the FIG. 2 system a radio frequency signal, a signal from a global position system satellite for example, is coupled, by way of the antenna and associated radio frequency amplification and processing shown at 200 and 202, to the data squaring function shown at 208. As indicated at 206 the radio frequency processing at 202 in FIG. 2 has preferably changed the frequency of the 1575.42 megahertz C/A code to a frequency of 21.25 megahertz by way of a conventional local oscillator and mixer down conversion process for example. This 21.25 megahertz frequency avoids spectrum overlap difficulty in the low frequency processing steps. The terms "local oscillator and mixer" and "analog to digital converter apparatus" as used in connection with the blocks 202 and 204 in FIG. 2 usually are understood to imply the use of hardware elements in their embodiment, for present purposes however it is intended that the FIG. 2 system not be limited to hardware embodiment and that mathematically equivalent software processing also be included.

The analog to digital converter at 204 samples the 21.25 megahertz signal at a rate of 5.0 megahertz as is discussed below herein and provides a digital output signal of 1.25 megahertz center frequency and 2.5 megahertz maximum bandwidth for input to the point-by-point data squaring circuit 208. The 2.5 megahertz bandwidth here corresponds to the bandwidth of the GPS C/A code signal. The point-by-point data squaring circuit 208 mechanizes the above-recited equations 1 and 2 and provides an output signal of doubled frequency together with a term of constant value i.e., a direct current signal component as described in equation 2 above. The 5 megahertz sampling scheme aliases the input signal to 1.25 megahertz thus, the digitized signal is centered at 1.25 MHz with a notch to notch bandwidth of 2.046 megahertz for a GPS signal.

In view of an interest in processing aircraft-related signals in an utilizing the present invention the expected Doppler frequency embedded in the carrier signal to the analog-to-digital converter 204 is considered to be twice as large as that of most vehicle-related Doppler systems or ±10 KHz. Once the input signal is squared, the phase modulation component will be eliminated and the signal becomes a continuous wave with embedded Doppler as shown in Equation (2). The expected Doppler frequency modulation of this continuous wave signal is extended to ±20 kilohertz through the frequency doubling process.

In the FIG. 2 system the input signal is sampled at the rate of 5 megahertz in the analog to digital converter 204 in order to accommodate the input bandwidth of 2.046 megahertz. However, after the frequency doubling in the point-by-point data squaring circuit 208 the signal is a continuous wave with an expected bandwidth of 40 kilohertz as a result of the doubled Doppler component. From a sampling point of view, a signal having a 40 kilohertz bandwidth need only have been sampled at an 80 kilohertz rate to accommodate the input bandwidth. If the signal is converted to a Doppler baseband, then averaging can be performed (as in a low pass filter or a hardware/software embodied algorithm) to eliminate the unwanted frequencies produced from the down conversion Doppler signal processing.

In the FIG. 2 system the data of double frequency provided by the point-by-point data squaring circuit 208 now has a center frequency of 2.5 megahertz and a bandwidth of 5 megahertz and is accompanied by a constant value term as discussed in connection with equations 1 and 2 above. This constant value term is not of interest in the present invention since the signals of concern do not extend so low in frequency as the direct current represented by such a constant value term; i.e., the constant value term has a magnitude of zero in the present situation. The block 210 in FIG. 2 represents a removal of this constant value term by subtraction of an average value of the output signal of the squaring circuit 208. Following removal of the constant value term the signal at the output of block 210 also has a 2.5 megahertz center frequency and a 5 megahertz bandwidth.

This 2.5 megahertz center frequency and 5 megahertz bandwidth signal may be further reduced in frequency in order to make the Fourier transformation operation easier to perform. Such frequency change may be accomplished by way of the second heterodyne mixer and local oscillator arrangements shown at 212 and 214 in the FIG. 2 drawing or may be accomplished by way of an equivalent mixer software routing, a routine inclusive of a signal multiplication arrangement, in the case of FIG. 2 being embodied in the form of software. The signal obtained from Equation (2) represents real data. Down converting the input frequency to a baseband frequency as accomplished at 212 in FIG. 2 however produces complex data, data having real and imaginary components or I and Q components. A complex data signal with a bandwidth of 40 kilohertz can be sampled at a 40 kilohertz rate to fulfill the Nyquist sample rate requirement in view of its two values at each data point. However, the input signal in the FIG. 2 system has been sample at a 5 megahertz sampling rate. From a sampling theory viewpoint therefore, the FIG. 2 input signal is over sampled 125 (5 megahertz/40 kilohertz) times. Therefore, 125 data points in the mixer 212 output signal can be averaged to one data point in order to save Fourier transformation calculation time.

Averaging of 125 data points to obtain one representative data point may of course be accomplished by way of numerical processing also performed in either software or hardware form, such processing is represented at 216 in the FIG. 2 system. The block 216 processing may also be performed in an equivalent low pass filter circuit or a software embodiment thereof. The data applied to the processing of block 216 is the 10 kilohertz Doppler signal of 20 kilohertz bandwidth that has been douled to 40 kilohertz by way of the squaring process in point-by-point data squaring circuit 208. This is the data applied to the fast Fourier transformation function represented at 218 in FIG. 2 in order that its Doppler frequency content i.e., the carrier frequency of the input signal from antenna 200 is identified. To determine carrier frequency at this point the local ascillator frequencies previously used are added to the Doppler frequency.

The Fourier transformation of block 218 is performed at 4000 points of the averaged data from block 216 since the original 500,000 points of data have been reduced by a factor of 125 in the accomplished averaging, i.e., 500,000/125=4000. Moreover only 2000 of these 4000 frequencies bin points are represented in the FIG. 4 drawing because the higher frequency components relate to noise rather than signal.

Therefore in using the invention the following steps are needed:

A. Square the input data to obtain $s^2$

B. Generate a complex ratio frequency (RF) data as $$rf=e^{j2\pi f_0 t} \tag{3}$$

with 500,000 points, where $f_0$=1.25 MHz.

C. Multiply $s^2$ and rf to convert the input to a complex data at baseband

D. Average 125 points to obtain a new set of data. The total data points are 4,000 (500,000/125).

E. Perform 4000 point FFT to obtain the desired frequencies.

Even though with use of the present invention one needs to perform three additional steps, the steps B. C and D recited above, the overall calculation is much simpler than with the presently used process involving performance of a 500,000 point Fourier transformation.

Figure 3:
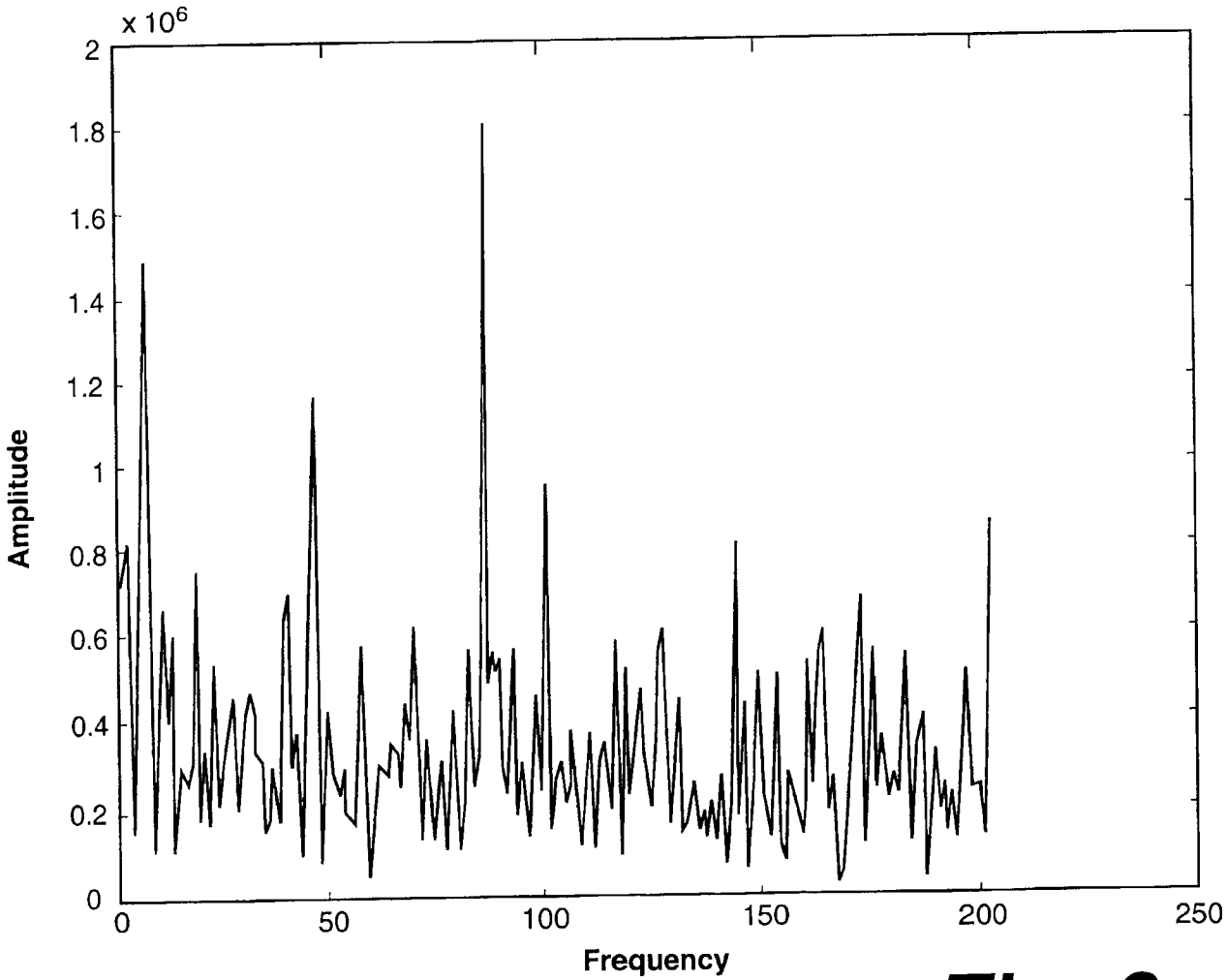
FIG. 3 shows a short data sample determination of carrier frequencies in signals received from four different global position system satellites.
Figure 4:
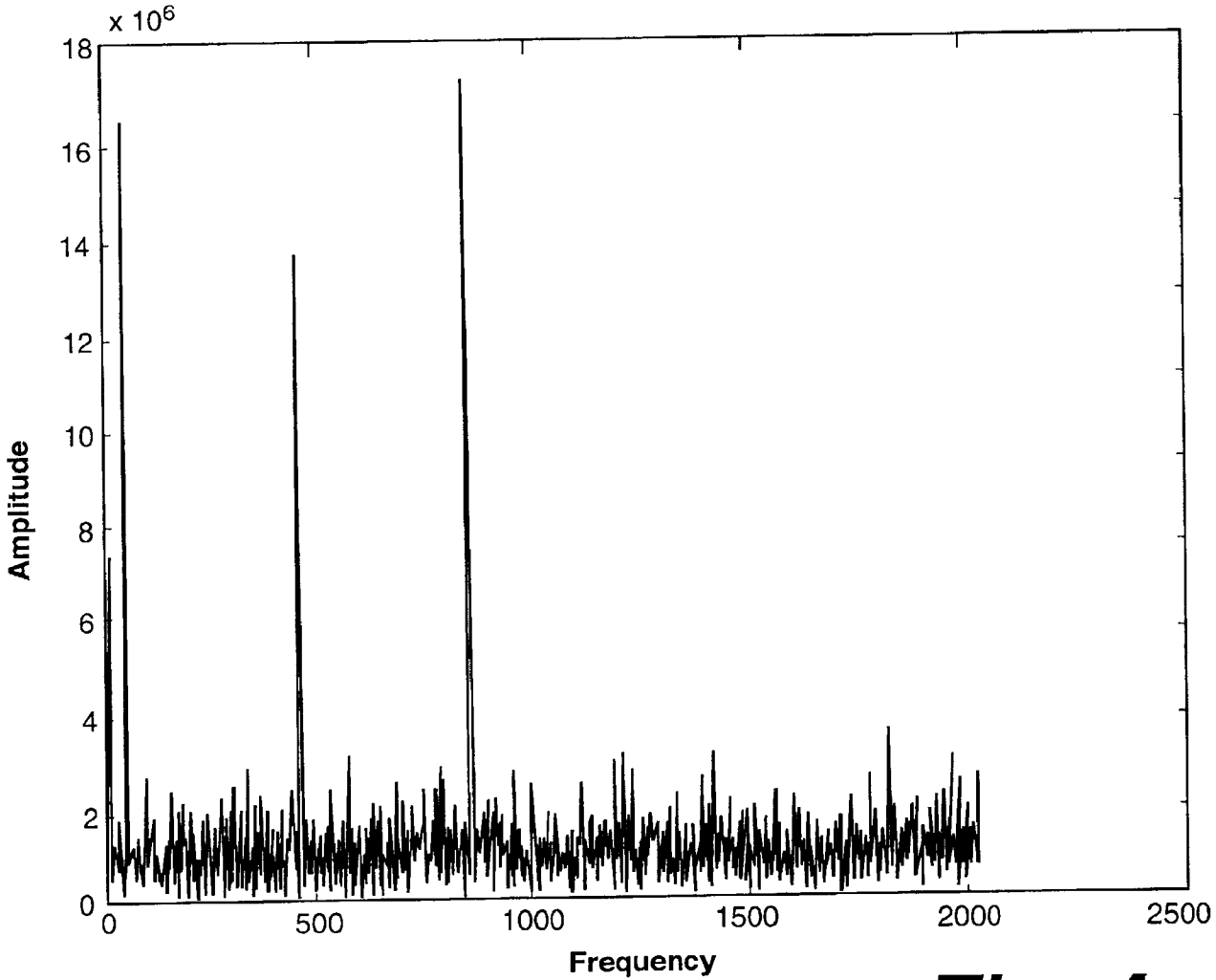
FIG. 4 shows a longer data sample determination of carrier frequencies in signals received from four different global position system satellites.

FIGS. 3 and 4 in the drawings show results obtained with use of the present invention to process a sample of actual data collected from satellites providing four carrier signals. FIG. 3 shows the result from a ten-millisecond sample of data; this result is not highly conclusive. FIG. 4 shows the result from a one hundred millisecond sample of data; this result is more conclusive and shows clearly there are four frequencies present in the data sample.

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the inventions in various embodiments and with various modifications as are suited to the particular scope of the invention as determined by the appended claims when interpreted in accordance with the breadth to which they are fairly, legally and equitably entitled.

We claim:

1. A method of determining carrier frequency of a biphase code-modulated radio frequency input signal, said method comprising the steps of:

converting a sample of said biphase code-modulated radio frequency input signal from an analog signal format to a first sequence of digital signals;

generating a second sequence of signals from said first sequence of digital signals by performing a point by point squaring of said first sequence digital signals;

removing a direct current component from said squared first sequence, second sequence, signals to form a third sequence of signals;

mixing a local oscillator signal with said third sequence signals to form a frequency down converted sequence of real signal and imaginary signal complex value pairs;

averaging selected length groupings of said real signal and said imaginary signal complex value pairs to form lowered frequency representations of said real signal sequence and said imaginary signal sequence;

combining said lowered frequency real signal sequence and said lowered frequency imaginary signal sequence to form a composite lowered frequency representation of said biphase code-modulated input signal; and identifying included frequency components of said biphase-code-modulated input signal by performing a Fourier transformation on said composite lowered frequency representation of said frequency down converted signals.

2. The method of determining carrier frequency of a biphase code-modulated radio frequency input signal of claim 1 wherein said radio frequency input signal comprises a course acquisition L1 code of a global position system signal.

3. The method of determining carrier frequency of a biphase code-modulated radio frequency input signal of claim 2 further including the step of down converting said course acquisition L1 code signal to a frequency of 21.25 megahertz prior to said converting analog signal format to a first sequence of digital signals step and wherein said converting analog signal format to a first sequence of digital signals step includes sampling said 21.25 megahertz signal at a rate of 5 megahertz.

4. The method of determining carrier frequency of a biphase code-modulated radio frequency input signal of claim 3 wherein said step of sampling said 21.25 megahertz signal at a rate of 5 megahertz comprises a one hundred twenty five times over sampling with respect to a Nyquist sampling requirement.

5. The method of determining carrier frequency of a biphase code-modulated radio frequency input signal of claim 1 wherein said step of generating a second sequence of signals from said first sequence of digital signals by performing a point by point squaring of said first sequence digital signals includes generating a signal mathematically characterized by having a doubled input frequency term and constant value term.

6. The method of determining carrier frequency of a biphase code-modulated radio frequency input signal of claim 1 wherein said sequence of steps is performed in one of a real time and an off-line operating modes.

7. The method of determining carrier frequency of a biphase code-modulated radio frequency input signal of claim 1 wherein said step of removing a direct current component from said squared first sequence, second sequence, signals to form a third sequence of signals includes subtracting an average value signal from said second sequence signals.

8. The method of determining carrier frequency of a biphase code-modulated radio frequency input signal of claim 1 wherein said radio frequency input signal includes a Doppler shift component of frequency between zero and ten kilohertz frequency.

9. The method of determining carrier frequency of a biphase code-modulated radio frequency input signal of claim 1 wherein said Fourier transformation comprises a fast Fourier transformation.

10. Biphase code-modulated radio frequency input signal carrier frequency determination apparatus, said apparatus comprising:

analog to digital converter means for converting a sample of said biphase code-modulated radio frequency input signal to a first sequence of digital signals;

multiplication means for generating a second sequence of signals from said first sequence of digital signals by performing a point by point squaring of said first sequence digital signals;

average value-subtraction means for removing a direct current component from said second sequence signals to form third sequence signals;

local oscillator and heterodyne mixer means for adding a local oscillator circuit output signal to said third sequence signals to form a frequency down converted sequence of complex value pairs;

means for averaging selected length groupings of said real signal and said imaginary signal complex value pairs to form lowered frequency representations of said real signal sequence and said imaginary signal sequence;

means for combining said lowered frequency real signal sequence and said lowered frequency imaginary signal sequence to form a composite lowered frequency signal sequence representation of said biphase code-modulated input signal; and Fourier transformation means for identifying included frequency components of said biphase-coded input signal in said composite lowered frequency representation of said frequency down converted signals.

11. The biphase code-modulated radio frequency input signal carrier frequency determination apparatus of claim 10 wherein said apparatus comprises a portion of a global position signal sensing radio receiver.

12. The biphase code-modulated input signal carrier frequency determination apparatus of claim 10 further including means for converting said course acquisition L1 code signal to a frequency of 21.25 megahertz prior to said analog to digital converter means.

13. The biphase code-modulated radio frequency input signal carrier frequency determination apparatus of claim 10 wherein said analog to digital converter means includes a 21.25 megahertz input frequency and a 5 megahertz sampling frequency.

14. The biphase code-modulated radio frequency input signal carrier frequency determination apparatus of claim 10 wherein said multiplication means for generating a second sequence of signals from said first sequence of digital signals by performing a point by point squaring of said first sequence digital signals comprises means for generating a signal mathematically characterized by having a doubled input frequency term and constant value term.

15. The biphase code-modulated radio input signal carrier frequency determination apparatus of claim 10 wherein said local oscillator and heterodyne mixer means are characterized by an input frequency of two and one half megahertz and a Doppler output frequency of ten kilohertz.

16. The biphase code-modulated radio input signal carrier frequency determination apparatus of claim 10 wherein said local oscillator and heterodyne mixer means frequency down converted sequence of complex value pairs includes a sequence of real signal values and a sequence of imaginary signal values of equal sequence lengths.

17. The method of determining carrier frequency of a digitally converted, mathematically squared, frequency doubled, dc component-removed, representation of an analog biphase modulated radio frequency input signal, said method comprising the steps of:

converting said squared, frequency doubled, dc component-removed, representation of a biphase modulated radio frequency input signal to a first signal of lowered frequency composition in a heterodyning mixer process;

said first signal of lowered carrier frequency having recombined complex real and imaginary signal components generated during said converting step;

generating a succession of representative average magnitudes of said recombination signal of lowered carrier frequency over selected time intervals;

said succession of representative average magnitudes comprising a second signal of additionally lowered frequency content representing said radio frequency input signal; and determining a frequency content of said second signal of additionally lowered frequency content using Fourier transformation processing.

* * * * *